US008482364B2

(12) United States Patent
Floyd et al.

(10) Patent No.: US 8,482,364 B2
(45) Date of Patent: Jul. 9, 2013

(54) DIFFERENTIAL CROSS-COUPLED POWER COMBINER OR DIVIDER

(75) Inventors: Brian Allan Floyd, Mahopac, NY (US); Arun Sridhar Natarajan, Yorktown Heights, NY (US); Scott Kevin Reynolds, Amawalk, NY (US); Mehmet Soyuer, Stamford, CT (US); Alberto Valdes Garcia, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 412 days.

(21) Appl. No.: 12/788,910

(22) Filed: May 27, 2010

(65) Prior Publication Data

US 2011/0063048 A1  Mar. 17, 2011

Related U.S. Application Data

(60) Provisional application No. 61/241,950, filed on Sep. 13, 2009.

(51) Int. Cl.
*H01P 5/12* (2006.01)
(52) U.S. Cl.
USPC ............................................ 333/136; 333/100
(58) Field of Classification Search
USPC .................. 333/100, 124–129, 132, 134, 136
See application file for complete search history.

(56) References Cited

U.S. PATENT DOCUMENTS

| | | | |
|---|---|---|---|
| 4,774,481 A * | 9/1988 | Edwards et al. | 333/127 |
| 5,473,332 A | 12/1995 | James et al. | |
| 6,819,914 B2 | 11/2004 | Yan et al. | |
| 7,139,547 B2 | 11/2006 | Wakayama et al. | |
| 7,139,548 B2 | 11/2006 | Hayashi et al. | |
| 7,184,735 B2 | 2/2007 | Bhatti et al. | |
| 7,215,940 B2 | 5/2007 | Goddard et al. | |
| 7,218,163 B2 | 5/2007 | Hanke et al. | |
| 7,502,631 B2 | 3/2009 | Hashemi et al. | |
| 2005/0130600 A1 | 6/2005 | Gordon | |
| 2006/0267734 A1 | 11/2006 | Taki et al. | |

(Continued)

FOREIGN PATENT DOCUMENTS

| | | |
|---|---|---|
| DE | 102006046728 A1 | 4/2008 |
| FR | 939381 A | 11/1948 |
| WO | PCT/EP2010/062349 | 11/2010 |

OTHER PUBLICATIONS

Ulrich H. Gysel, "A New N-Way Power Divider/Combiner Suitable for High-Power Applications," IEEE MTT-S IMS Digest, May 1975, pp. 116-118.

(Continued)

*Primary Examiner* — Robert Pascal
*Assistant Examiner* — Kimberly Glenn
(74) *Attorney, Agent, or Firm* — Anne V. Dougherty; Ryan, Mason & Lewis, LLP

(57) ABSTRACT

A differential cross-coupled power combiner in one aspect comprises a plurality of inputs, an output, a plurality of differential transmission lines each coupled between a corresponding one of the inputs and the output, and at least one set of additional differential transmission lines arranged in series between any two of the inputs. First and second ones of the additional differential transmission lines in the set are coupled to one another using a cross-coupling arrangement. Other aspects of the invention provide a differential cross-coupled power divider, communication system receivers and transmitters incorporating respective power combiners and dividers, and integrated circuit implementations of power combiners and dividers.

20 Claims, 8 Drawing Sheets

U.S. PATENT DOCUMENTS

| | | |
|---|---|---|
| 2008/0032639 A1 | 2/2008 | Kee et al. |
| 2008/0096498 A1 | 4/2008 | Kintis et al. |
| 2008/0113643 A1 | 5/2008 | Guan et al. |

OTHER PUBLICATIONS

A. Natarajan et al., "A Bidirectional RF-Combining 60GHz Phased-Array Front-End," IEEE International Solid-State Circuits Conference, Feb. 2007, pp. 202-204.

A. Natarajan et al., "60GHz RF-Path Phase-Shifting Two-Element Phased-Array Front-End in Silicon," IEEE Symposium on VLSI Circuits Digest of Technical Papers, Jun. 2009, pp. 250-251.

S.K. Reynolds et al., "A Silicon 60-GHz Receiver and Transmitter Chipset for Broadband Communications," IEEE Journal of Solid-State Circuits, Dec. 2006, pp. 2820-2831, vol. 41, No. 12.

E. Cohen et al., "A Bidirectional TX/RX Four Element Phased-Array at 60GHz with RF-IF Conversion Block in 90nm CMOS Process," IEEE Radio Frequency Integrated Circuits Symposium, Jun. 2009, pp. 207-210.

S. Reynolds et al., "Second Generation 60-GHz Transceiver Chipset Supporting Multiple Modulations at Gb/s Data Rates (Invited)," IEEE Bipolar/BiCMOS Circuits and Technology Meeting, Sep. 2007, pp. 192-197.

J.M. Gilbert et al., "A 4-Gbps Uncompressed Wireless HD A/V Transceiver Chipset," IEEE Micro, Mar. 2008, pp. 56-64, vol. 28, No. 2.

K-J. Koh et al., "A Millimeter-Wave (40-45 GHz) 16-Element Phased-Array Transmitter in 0.18-$\mu$m SiGe BiCMOS Technology," IEEE Journal of Solid-State Circuits, May 2009, pp. 1498-1509, vol. 44, No. 5.

S. Kishimoto et al., "A 60-GHz Band CMOS Phased Array Transmitter Utilizing Compact Baseband Phase Shifters," IEEE Radio Frequency Integrated Circuits Symposium, Jun. 2009, pp. 215-218.

U.S. Appl. No. 12/750,242, filed Mar. 30, 2010 and entitled "Phased-Array Transceiver for Millimeter-Wave Frequencies."

Pham et al., "A 5.8GHz, 47% Efficiency, Linear Outphase Power Amplifier with Fully Integrated Power Combiner," Radio Frequency Integrated Circuits (RFIC) Symposium, 2006, 4 pages.

J. Gonzalez et al., "A New High-Frequency Wide-Band 180-Degrees Differential Power Splitter," Analog Integrated Circuits and Signal Processing, Nov. 1996, pp. 231-241, vol. 11, No. 3.

G. Vandersteen et al., "Broadband High-Frequency Hybrid," IEEE Transactions on Instrumentation and Measurement, Dec. 2002, pp. 1204-1209, vol. 51, No. 6.

\* cited by examiner

DIFFERENTIAL CROSS-COUPLED POWER COMBINER OR DIVIDER

RELATED APPLICATION

The present application claims the priority of U.S. provisional patent application Ser. No. 61/241,950, filed Sep. 13, 2009 and entitled "Differential Power Combiner with Common Mode Rejection and Frequency Filtering," the disclosure of which is incorporated by reference herein.

FIELD OF THE INVENTION

The present invention relates generally to power combining or dividing circuitry, and more particularly to power combining or dividing of electrical signals.

BACKGROUND OF THE INVENTION

Power combiners or dividers are used in a wide variety of signal combination or distribution applications. By way of example, one such application is in radio frequency (RF) phased array receivers and transmitters. Generally, a power combiner combines multiple input signals into a single output signal, and a power divider divides a single input signal into multiple output signals. Power combiners or dividers that do not require any power supply are referred to as passive combiners or dividers. The same passive circuitry can be used as both a combiner and a divider.

FIG. 1 shows a simple combiner or divider comprising passive circuitry 100 and three ports denoted Port 1, Port 2 and Port 3. This device is configured to function as a combiner if Port 1 is an output and Ports 2 and 3 are inputs, and is configured to function as a divider if Port 1 is an input and Ports 2 and 3 are outputs. It should therefore be appreciated that any passive power combiner described herein can be represented as a passive power divider by simply considering the input ports of the combiner to be the output ports of the divider and the output port of the combiner to be the input port of the divider.

Desired properties in a passive combiner or divider include low insertion loss, compact circuit area, and isolation between the input ports for the combiner or the output ports for the divider. For simplicity, the following description will focus primarily on power combiners, with the understanding that extension to equivalent power dividers is straightforward.

FIG. 2 shows a conventional N-way Wilkinson power combiner. This combiner includes N input ports denoted Port 1 through Port N, and a single output port denoted Port N+1. At a particular frequency $f_o$, an ideal Wilkinson combiner is lossless and the N input ports are isolated from one another. A quarter-wave transmission line of impedance $\sqrt{N}Z_0$ is coupled between each input port and the output port. An isolation resistor network includes isolation resistors $NZ_0$ coupled between Ports 1 and 2, Ports 2 and 3, and so on. For additional details on this type of combiner or divider structure, see E. J. Wilkinson, "An N-way hybrid power divider," IRE Trans. on Microwave Theory and Tech., pp. 116-118, January 1960.

While a Wilkinson combiner is well-suited for certain applications, a major challenge is the fact that the inputs have to be physically close to each other in order to connect the isolation resistor network to the inputs. There are many combiner applications, such as the above-noted phased array receiver, in which the input sources may be located relatively far from each other. Using a Wilkinson combiner in such applications will often require unduly long lines to connect the isolation resistor network to the inputs, thereby increasing both insertion loss and the required circuit area.

Similar problems arise in differential Wilkinson power combiners, such as the simple two-way combiner shown in FIG. 3. Like the single-ended inputs in the N-way combiner of FIG. 2, the differential inputs at Ports 2 and 3 in this two-way combiner have to be located close to each other in order to achieve the desired isolation.

FIG. 4 illustrates a conventional two-way Gysel power combiner. This combiner includes two input ports denoted Port 2 and Port 3, a single output port denoted Port 1, transmission lines $L_0$ through $L_6$, and resistors $R_1$ and $R_2$. There are no isolation resistors coupled between the inputs. Instead, this combiner uses the transmission lines $L_3$, $L_4$, $L_5$ and $L_6$, and the resistors $R_1$ and $R_2$, to achieve isolation. For additional details on this type of combiner or divider structure, see U. H. Gysel, "A New N-Way Power Divider/Combiner Suitable for High-Power Applications," IEEE MTT-S IMS Digest, May 1975, pp. 116-118. While in this structure the inputs no longer need to be located close to each other, the lines $L_3$, $L_4$, $L_5$ and $L_6$ have a total length of λ, where λ is the wavelength at the frequency of interest. This requirement for long transmission lines between the input ports unduly increases the required circuit area.

SUMMARY OF THE INVENTION

Illustrative embodiments of the present invention provide a compact N-way differential power combiner or divider in which the inputs or outputs do not need to be physically located close to each other. By cross coupling the differential lines used in an isolation section, the combiner simultaneously achieves the goals of small physical size and physical separation of inputs or outputs. The differential combiner or divider structure can also be modified for filtering out certain frequencies and for improving common-mode rejection.

In one aspect of the invention, a differential cross-coupled power combiner comprises a plurality of inputs, an output, a plurality of differential transmission lines each coupled between a corresponding one of the inputs and the output, and at least one set of additional differential transmission lines arranged in series between any two of the inputs. First and second ones of the additional differential transmission lines in the set are coupled to one another using a cross-coupling arrangement.

In another aspect of the invention, a differential cross-coupled power divider comprises a plurality of outputs, an input, a plurality of differential transmission lines each coupled between the input and a corresponding one of the outputs, and at least one set of additional differential transmission lines arranged in series between any two of the outputs. First and second ones of the additional differential transmission lines in the set are coupled to one another using a cross-coupling arrangement.

In one or more of the illustrative embodiments, the cross-coupling arrangement is implemented such that a positive lead of the first differential transmission line in the set of additional differential transmission lines is coupled to a negative lead of the second differential transmission line in the set, and a negative lead of the first differential transmission line in the set is coupled to a positive lead of the second differential transmission line in the set.

The disclosed power combiners and dividers are particularly well suited for use in communication system elements such as receivers and transmitters, and more particularly in phased array receivers and transmitters, each of which may be implemented in the form of one or more integrated circuits.

The disclosed combiners and dividers can considerably simplify the routing in communication hardware such as phased array receivers where signals from multiple inputs which are located far from each other have to be combined. For example, the routing from multiple inputs can also now be incorporated into the combiner structure itself, thereby reducing circuit area. Similar advantages are provided in phased array transmitters where signals need to be distributed to multiple outputs which are located far from each other.

These and other features and advantages of the present invention will become more apparent from the accompanying drawings and the following detailed description.

DETAILED DESCRIPTION OF PREFERRED EMBODIMENTS

The present invention will be illustrated herein in conjunction with power combining or dividing circuitry and associated systems that incorporate that circuitry, such as phased array receivers and transmitters. It should be understood, however, that the invention is not limited to use with the particular types of power combining or dividing circuitry and associated systems that are expressly disclosed. The invention can be implemented using a wide variety of other types of power combining or dividing circuitry, and in numerous other system applications. For example, although certain embodiments are described herein as being implemented in the form of a phased array transmitter or receiver, the disclosed power combining or dividing circuitry can be utilized in alternative applications such as chip to chip signal distribution.

Figure 5:
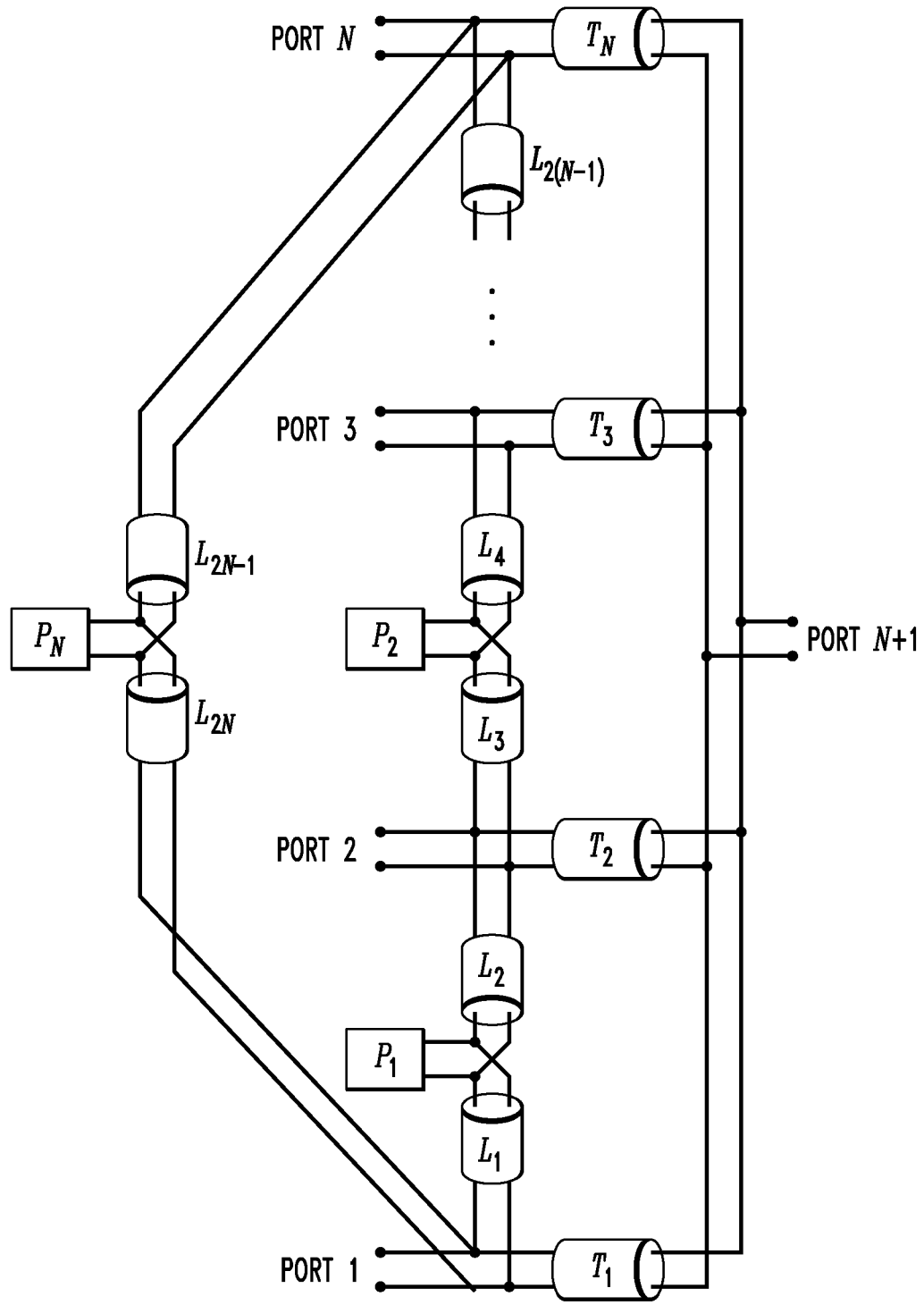
FIG. 5 shows an N-way differential power combiner or divider with cross coupling in an illustrative embodiment of the invention.

An illustrative embodiment of the invention is shown in FIG. 5. The device shown may be utilized as an N-way differential power combiner or as an N-way differential power divider. It will be described below as a combiner, but its analogous use as a divider will be readily apparent, as is also the case for the additional embodiments shown in FIGS. 6 and 7.

The FIG. 5 combiner includes N input ports denoted Port 1 through Port N, and a single output port denoted Port N+1. Differential transmission lines $T_1, T_2, \ldots T_N$ connect respective ones of the N input ports to the output port. Pairs of differential transmission lines are coupled between respective pairs of input ports. More specifically, differential transmission lines $L_1$ and $L_2$ are coupled between Ports 1 and 2, differential transmission lines $L_3$ and $L_4$ are coupled between Ports 2 and 3, ... and differential transmission lines $L_{2N-1}$ and $L_{2N}$ are coupled between Ports 1 and N.

As shown in the figure, cross coupling is introduced between the two differential transmission lines in each such pair of transmission lines, that is, between transmission lines $L_1$ and $L_2$, transmission lines $L_3$ and $L_4$, ... and transmission lines $L_{2N-1}$ and $L_{2N}$. The cross coupling is achieved for a given pair of these transmission lines by coupling upper and lower leads of one of the differential lines of the pair with respective lower and upper leads of the other differential line of the pair. Such cross coupling introduces an additional phase shift. The upper and lower leads of a given differential transmission line are more generally referred to herein as positive and negative leads, respectively, of the differential transmission line. Accordingly, this exemplary cross coupling arrangement will be described herein as coupling positive and negative leads of one of the differential lines of the pair with respective negative and positive leads of the other differential line of the pair.

Also, as illustrated, passive or active networks $P_1, P_2, \ldots P_N$ are coupled to respective ones of the cross-coupling points as shown. A given such passive or active network may comprise, for example, a particular arrangement of resistors, capacitors, inductors, transistors or other passive or active circuit elements, configured in a straightforward manner to achieve a desired frequency filtering or common-mode rejection, as will be appreciated by those skilled in the art. A given embodiment of the invention may utilize any desired combination of passive and active networks.

Any or all of the transmission lines in the FIG. 5 embodiment, and other embodiments disclosed herein, may be quarter-wavelength long at the frequency of interest. Also, the transmission line odd-mode and even-mode impedances may be selected to provide odd-mode matching at the input and output ports and odd-mode isolation between the input ports.

Figure 6:
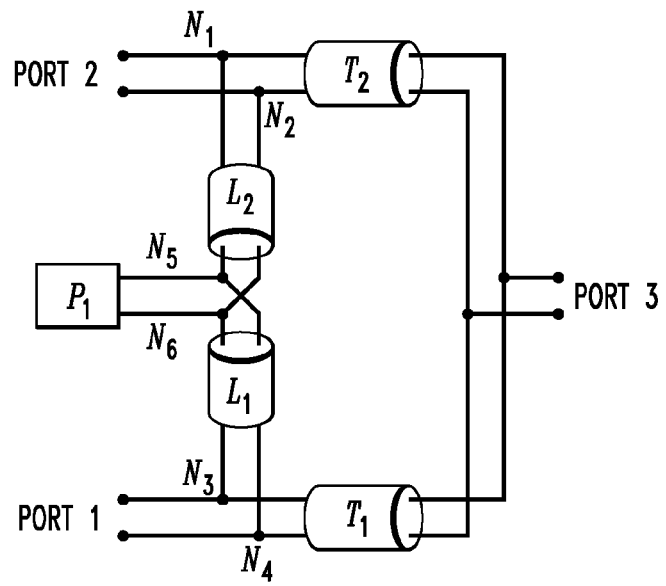
FIG. 6 shows a two-way differential power combiner or divider with cross coupling in an illustrative embodiment of the invention.

FIG. 6 shows a two-way implementation of the FIG. 5 combiner. This embodiment includes two input ports denoted Port 1 and Port 2, and a single output port denoted Port 3. Differential transmission lines $T_1$ and $T_2$ connect respective ones of the two input ports to the output port. Differential transmission lines $L_1$ and $L_2$ are coupled between Ports 1 and 2 and cross coupled to one another as shown. Nodes $N_1$ through $N_6$ are identified in the figure. Positive and negative leads of transmission line $L_1$ are coupled to positive and negative leads of transmission line $T_1$ at nodes $N_3$ and $N_4$, respectively. Similarly, positive and negative leads of transmission line $L_2$ are coupled to positive and negative leads of transmission line $T_2$ at nodes $N_1$ and $N_2$, respectively. The cross coupling between the leads of transmission lines $L_1$ and $L_2$ results in node $N_1$ being coupled to node $N_4$ and node $N_2$ being coupled to node $N_3$. Absent the cross coupling, serial connection of transmission lines $L_1$ and $L_2$ between Port 1 and Port 2 would result in node $N_1$ being coupled to node $N_3$ and node $N_2$ being coupled to node $N_4$. A passive network $P_1$ is inserted at the cross-coupling point between nodes $N_5$ and $N_6$ to provide isolation in the differential mode as well as an ability to introduce frequency filtering or common-mode rejection.

Figure 7:
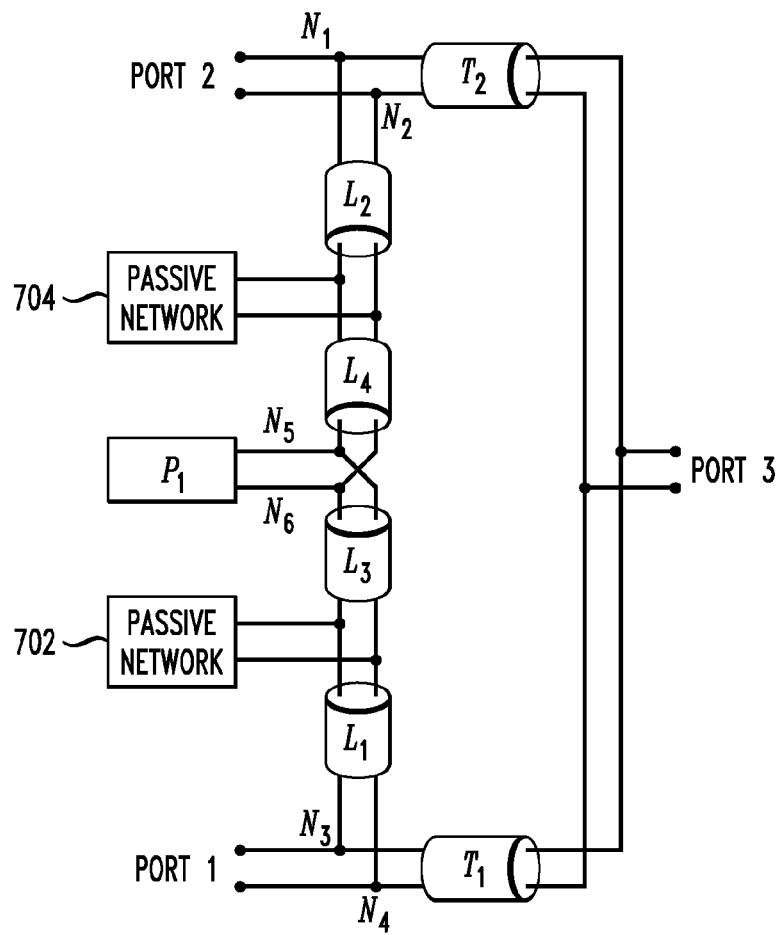
FIG. 7 shows a two-way differential power combiner or divider with cross coupling and passive networks for common-mode rejection or frequency filtering in an illustrative embodiment of the invention.

FIG. 7 shows another possible variant of the FIG. 6 two-way power combiner. Its operation is substantially the same as that of the FIG. 6 embodiment, but there are four differential transmission lines $L_1$, $L_2$, $L_3$ and $L_4$ arranged between Port 1 and Port 2. The cross coupling in this embodiment is provided between transmission lines $L_3$ and $L_4$. The passive network $P_1$ is again inserted at the cross-coupling point between nodes $N_5$ and $N_6$. Additional passive networks 702 and 704 are coupled between the positive and negative leads at the connection between lines $L_1$ and $L_3$, and at the connection between lines $L_2$ and $L_4$, respectively.

Figure 1:
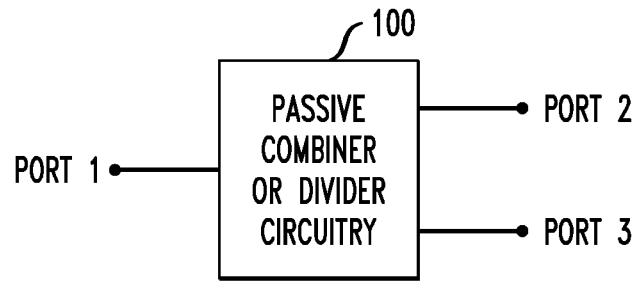
FIG. 1 shows a conventional two-way power combiner or divider.
Figure 2:
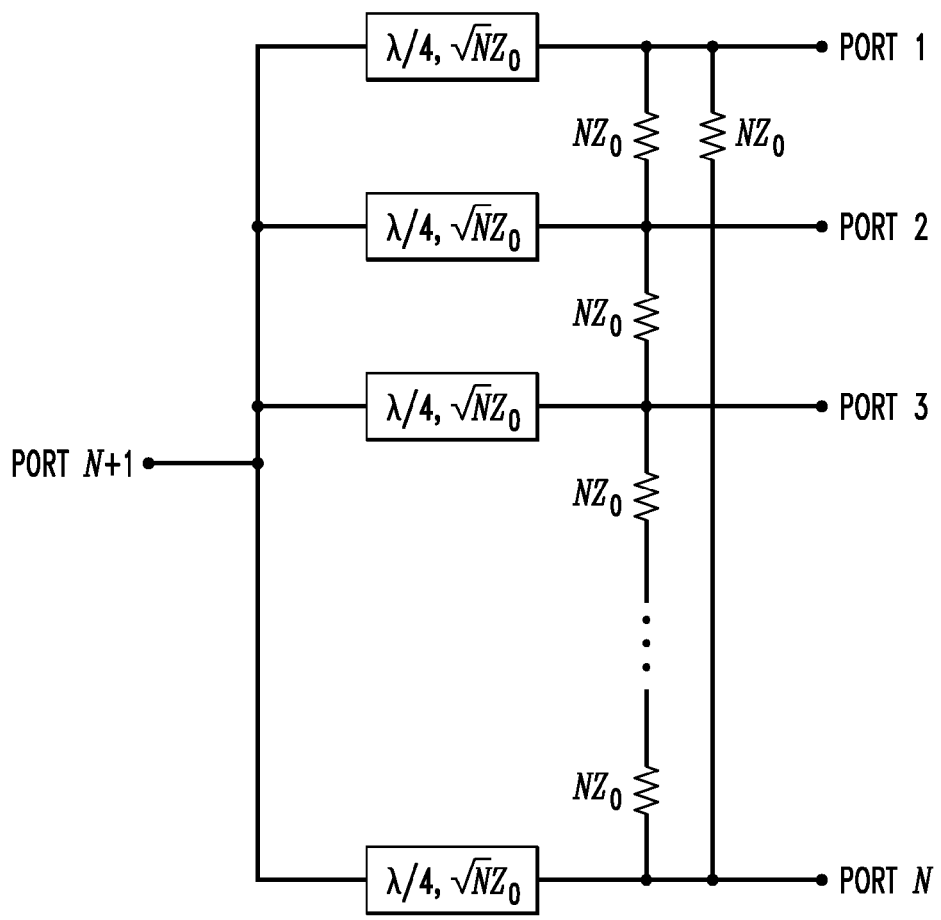
FIG. 2 shows a conventional N-way Wilkinson power combiner or divider.
Figure 3:
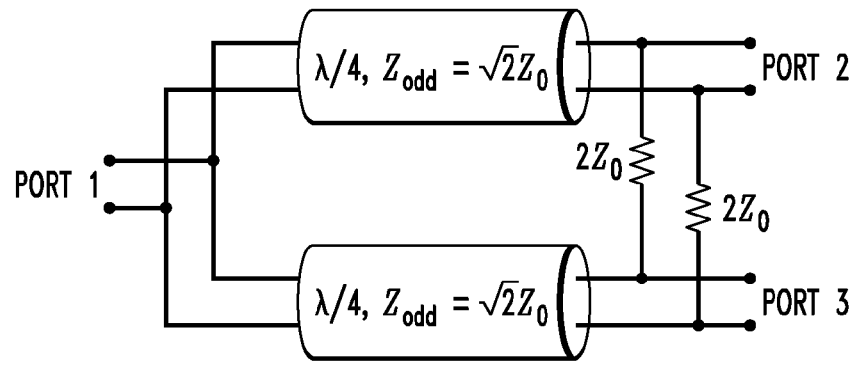
FIG. 3 shows a conventional two-way differential Wilkinson power combiner or divider.
Figure 4:
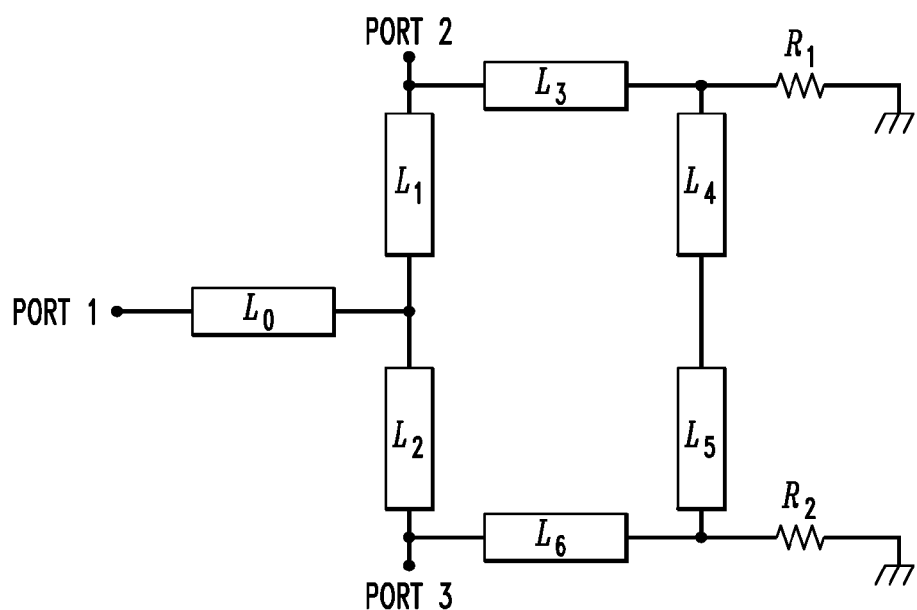
FIG. 4 shows a conventional two-way Gysel power combiner or divider.

The illustrative embodiments of FIGS. 5, 6 and 7 provide differential power combiners or dividers that isolate inputs or outputs while allowing the input ports or output ports to be physically far apart. The need for long transmission lines as in the conventional Gysel combiner or divider of FIG. 4 is avoided through the use of the above-described differential cross-coupling arrangement. This allows the combiner or divider to be more compact and area efficient, with low insertion loss, which is particularly important in integrated circuit implementations of phased array receivers or transmitters, and in other applications such as chip to chip signal distribution. Furthermore, passive networks for frequency filtering or common-mode signal rejection can also be incorporated as part of the power combiner or divider. The illustrative embodiments therefore enable differential routing capability with less area and loss while also providing additional filtering capability.

An exemplary phased array transceiver incorporating aspects of the present invention will now be described with reference to FIGS. 8 through 11. This phased array transceiver is of a type disclosed in U.S. patent application Ser. No. 12/750,242, filed Mar. 30, 2010 and entitled "Phased-Array Transceiver for Millimeter-Wave Frequencies," which is commonly assigned herewith and incorporated by reference herein.

Figure 8:
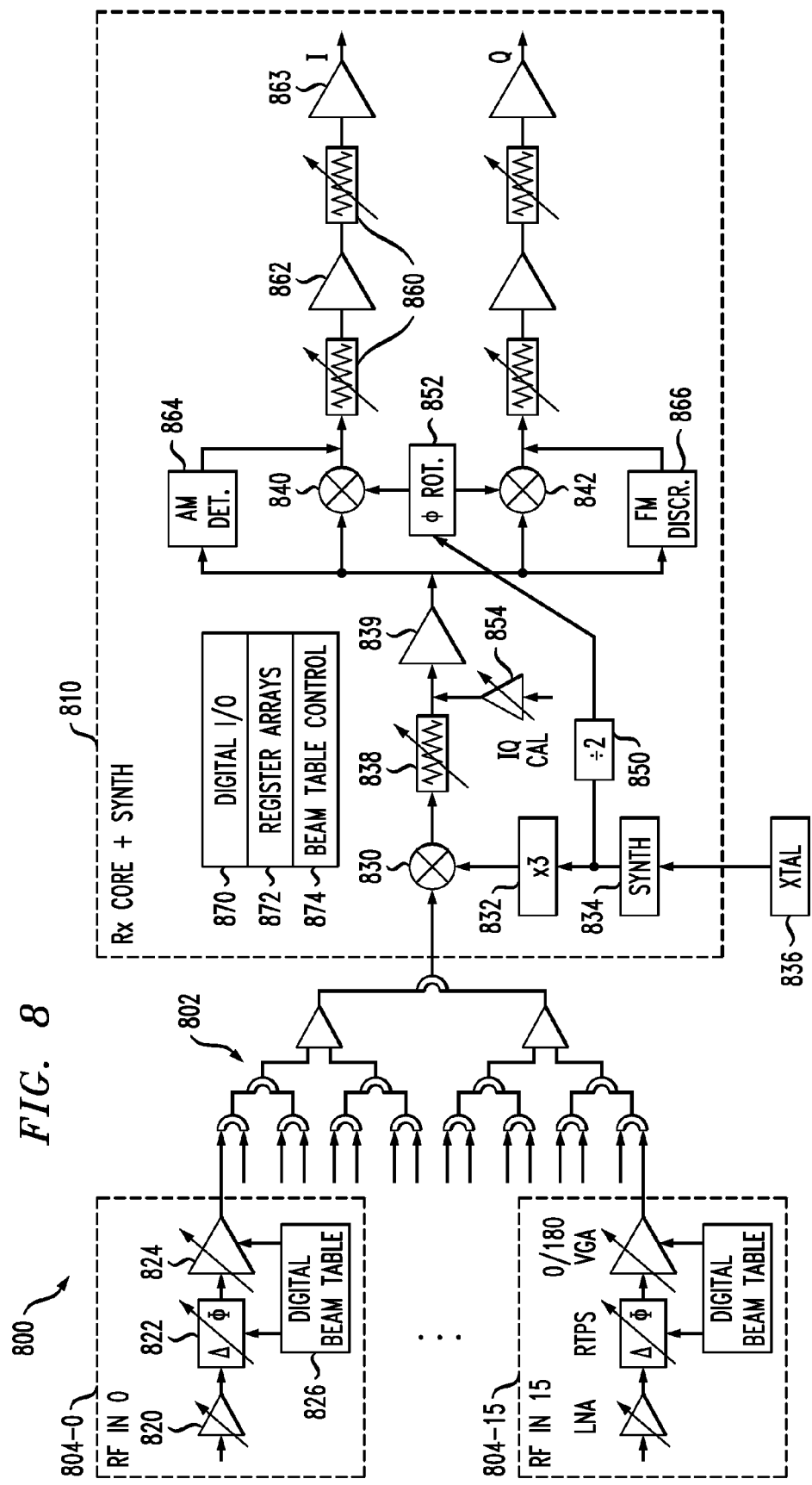
FIG. 8 is a block diagram of a phased array receiver incorporating a 16:1 power combiner in an illustrative embodiment.

FIG. 8 shows an example of a phased array receiver 800 that incorporates a 16:1 power combiner tree 802. The power combiner tree 802 includes multiple instances of the power combiner of FIG. 6, as will be illustrated in greater detail in FIG. 9. The phased array receiver 800 further includes 16 RF receiver front ends 804-0 through 804-15, and a receiver core and synthesizer unit 810. The phased array receiver 800 in this embodiment may be implemented in the form of an integrated circuit, for example, in 0.12-μm SiGe BiCMOS with fr=200 GHz. The phased array receiver is suitable for operation in the 57 to 66 GHz band for high rate (e.g., 1-10 Gb/s) wireless digital communication.

The RF front ends 804 each comprise a stepped-gain low noise amplifier (LNA) 820, a digitally-controlled phase shifter 822, and a phase-inverting) (0°/180°) variable gain amplifier (PIVGA) 824. Phase shifter 822 is a reflection-type phase shifter (RTPS) providing fine phase control (11±3° digital resolution, 0° to 180°) using varactor-adjusted loads on a 90° hybrid coupler. An additional 180° phase shift is achieved by inverting the output phase in the differential PIVGA following the passive phase shifter. The PIVGA also compensates for the phase-shift dependent loss of the RTPS, ensuring constant front-end gain across phase shift settings. A digital beam table 826 controls the phase shifter 822 and the PIVGA 824.

Figure 9:
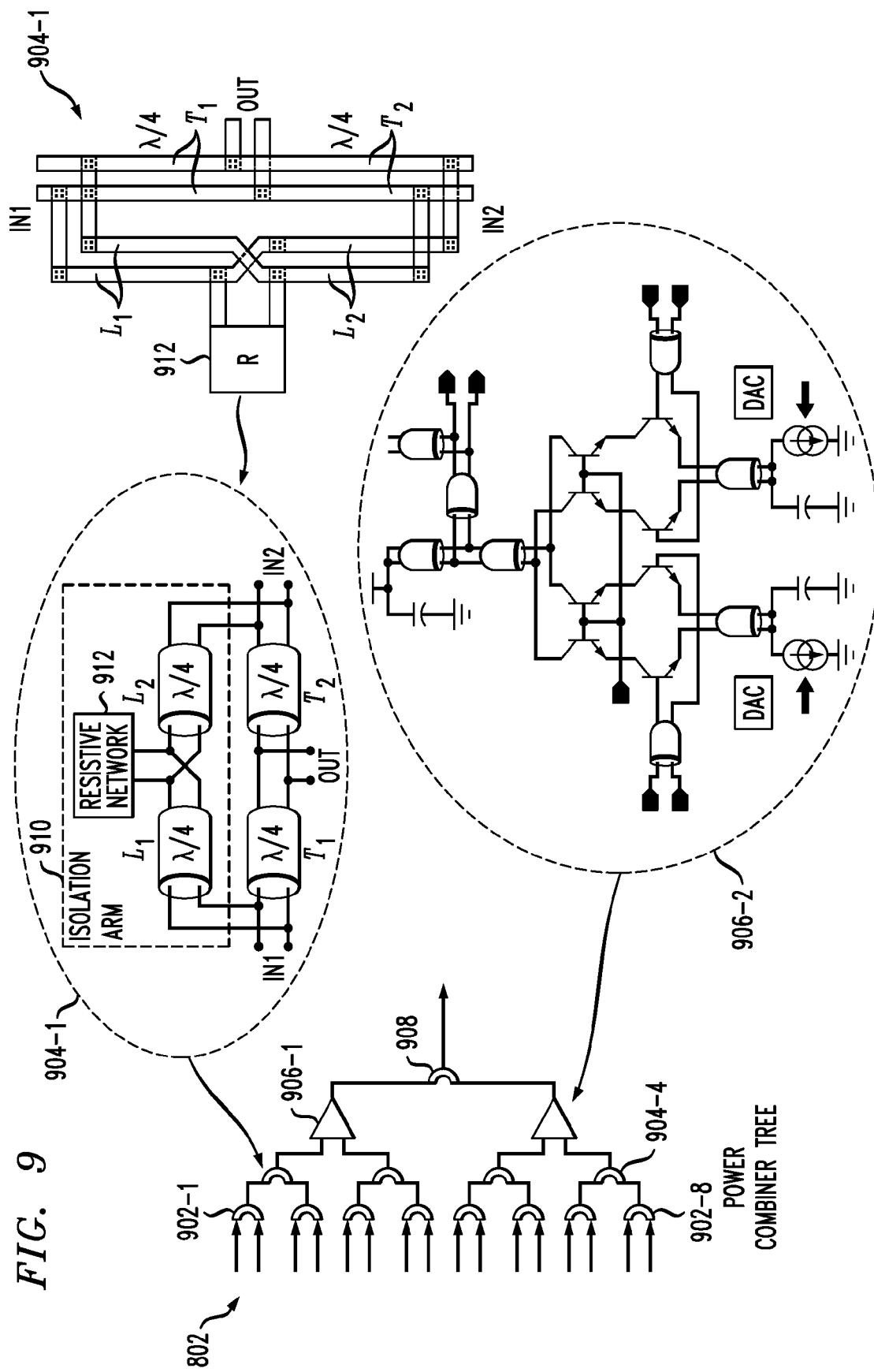
FIG. 9 shows more detailed views of the power combiner of the FIG. 8 receiver.

Referring now to FIG. 9, the power combiner tree 802 includes four levels of combiners, three of which include only passive combiners of the type shown in FIG. 6, and one of which includes only active combiners. At the first or leaf level of the combiner tree 802, there are eight two-way passive combiners 902-1 through 902-8, each receiving two input signals from respective ones of the 16 RF receiver front ends 804-0 through 804-15. At the second level of the combiner tree there are four two-way passive combiners 904-1 through 904-4, each receiving two input signals from two of the eight first level combiners. The third level of the combiner tree includes two two-way active combiners 906-1 and 906-2, each receiving two input signals from two of the four second level combiners. An inset shows a detailed example of one possible implementation of the two-way active combiner 906-2. At the fourth and final level of the tree, there is a single two-way passive combiner 908, which receives two input signals from the two active combiners of the third level.

Each of the two-way passive combiners 902, 904 and 908 of the power combiner tree 802 is configured in substantially the same manner as the combiner of FIG. 6. An example is shown in an inset for combiner 904-1 in FIG. 9. This particular combiner includes two input ports denoted IN1 and IN2, a single output port denoted OUT, and differential transmission lines $L_1$, $L_2$, $T_1$ and $T_2$. The transmission lines $L_1$ and $L_2$ are cross-coupled in the manner described in conjunction with FIG. 6. The cross-coupled transmission lines $L_1$ and $L_2$ are part of an isolation arm 910 that includes a resistive network 912. The resistive network 912 is an example of passive network $P_1$ of FIG. 6. Also shown in the figure is an illustration of a possible physical layout of the combiner 904-1. The other two-way passive combiners in the power combiner tree 802 may each be configured in substantially the same manner as combiner 904-1.

As shown in FIG. 8, the output of the power combiner tree 802 is applied to one input of an RF mixer 830, which may be implemented as a double-balanced Gilbert mixer. A 50-55.5 GHz local oscillator (LO) is provided by a frequency tripler 832 which receives a 16.7-18.5 GHz output from synthesizer 834. The synthesizer 834 is driven by an external crystal (XTAL) 836. The output of mixer 830 passes through a tunable IF filter, not shown, and a coarse (6-dB step) attenuator 838 before being buffered in buffer 839 and converted to a baseband signal by a second set of quadrature (IQ) mixers 840 and 842. The second LO for the IQ mixers is provided by a divide-by-2 circuit 850 operating from the synthesizer output. A phase rotator 852 following the divide-by-2 circuit 850 allows IQ accuracy to be adjusted to within ±1°.

An IF loop-back calibration feature may be used to permit finer IQ adjustment in the baseband. An IQ calibration VGA 854 allows path gain to be adjusted so calibration can be performed over baseband gain settings. The baseband signal passes through a cascade of coarse and fine (1-dB) step attenuators 860 and 16-dB fixed gain amplifiers 862 to provide the required gain range. Baseband output buffer 863 has 100-Ω differential output impedance and is designed to drive>500 mVppd into an off-chip 100-Ω differential load in a baseband analog-to-digital converter (ADC). Overall, the receiver core 810 provides +50 to −10 dB of gain in 1-dB steps. For fast automatic gain control (AGC), all receiver gain control bits may be grouped into two registers, which can be written in two 7.5-ns clock cycles. Other elements of the receiver core and synthesizer unit 810 in this embodiment include AM detector 864, FM discriminator 866, digital I/O 870, register arrays 872 and beam table control 874.

Figure 10:
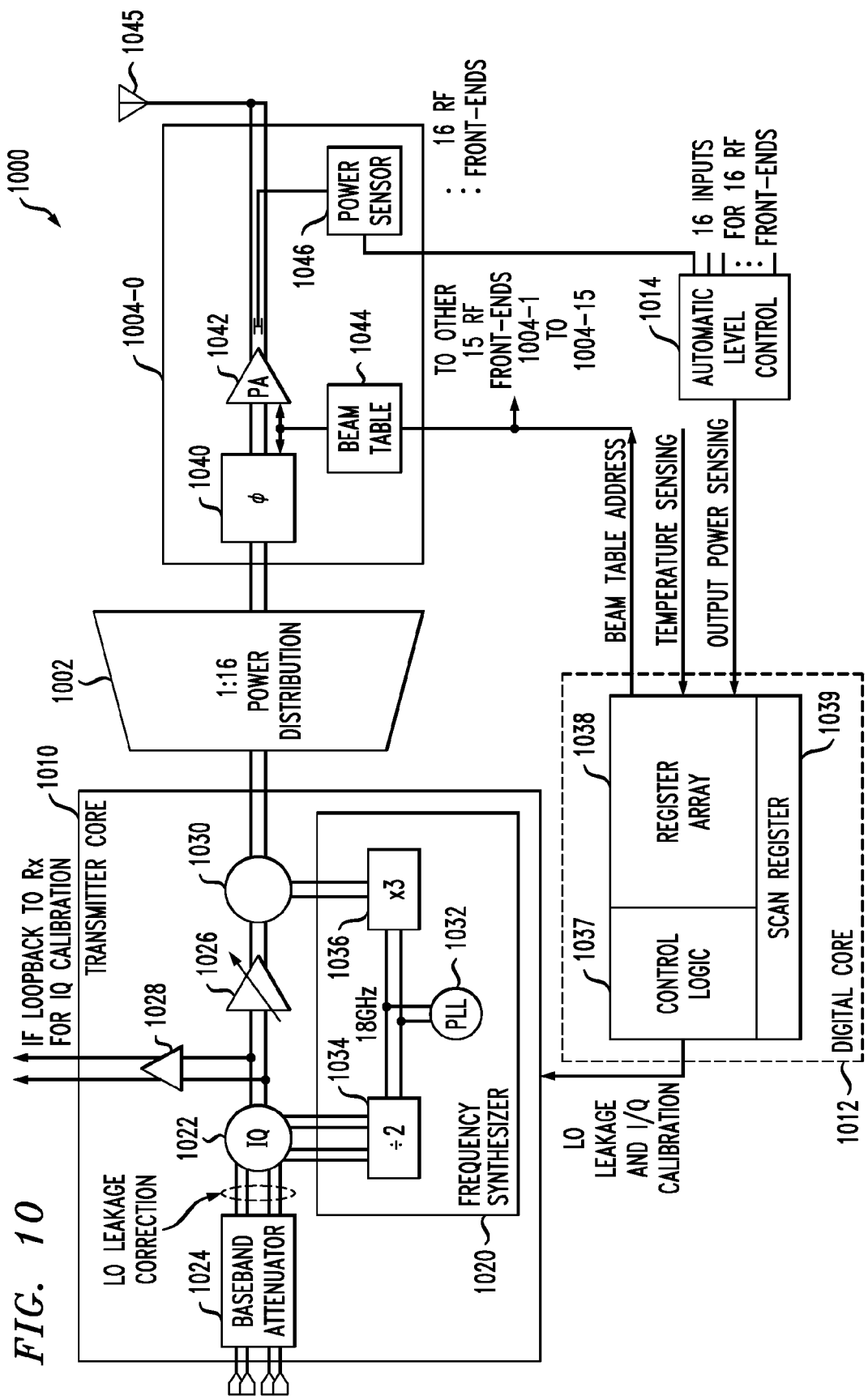
FIG. 10 is a block diagram of a phased array transmitter incorporating a 1:16 power divider in an illustrative embodiment.

FIG. 10 shows an example of a phased array transmitter 1000 that incorporates a 1:16 power divider tree 1002. The power divider tree 1002 includes multiple instances of the power divider of FIG. 6, as will be illustrated in greater detail in FIG. 11. The phased array transmitter 1000 further includes 16 RF transmitter front ends 1004-0 through 1004-15, a transmitter core 1010, a digital core 1012, and an automatic level control unit 1014. The phased array transmitter 1000 is configured for communication with the previously-described phased array receiver 800. Like the phased array receiver 800, the phased array transmitter in this embodiment may be implemented in the form of an integrated circuit, for example, in 0.12-μm SiGe BiCMOS, and is suitable for high rate wireless digital communication in the 57 to 66 GHz band.

The transmitter core 1010 comprises a frequency synthesizer 1020 and a multi-mode modulator 1022. It further includes a baseband attenuator 1024 programmable in steps of 6 dB for both I and Q branches simultaneously, and in steps of 1 dB independently in each branch for I/Q amplitude calibration. This combined with an IF-VGA 1026 having 20 dB of gain in steps of 1 dB allows for an overall programmable gain range of 40 dB which can be used to adjust the required level of back-off for each modulation format. A buffer 1028 is inserted after the first up-conversion to enable an IF loop-back connection with the receiver 800 for I/Q calibration purposes. The second up-conversion is performed by mixer 1030, which supplies its output to the power divider tree 1002. The LO signals for the first and second up-conversions are generated by the frequency synthesizer 1020, in which an output of phase-locked loop (PLL) 1032 is applied to a divide-by-two circuit 1034 and frequency tripler 1036. The digital core 1012 comprises a serial/parallel I/O interface, from which features of the transmitter can be controlled or monitored. Other elements of the digital core 1012 in this embodiment include control logic 1037, register array 1038, and scan register 1039.

Figure 11:
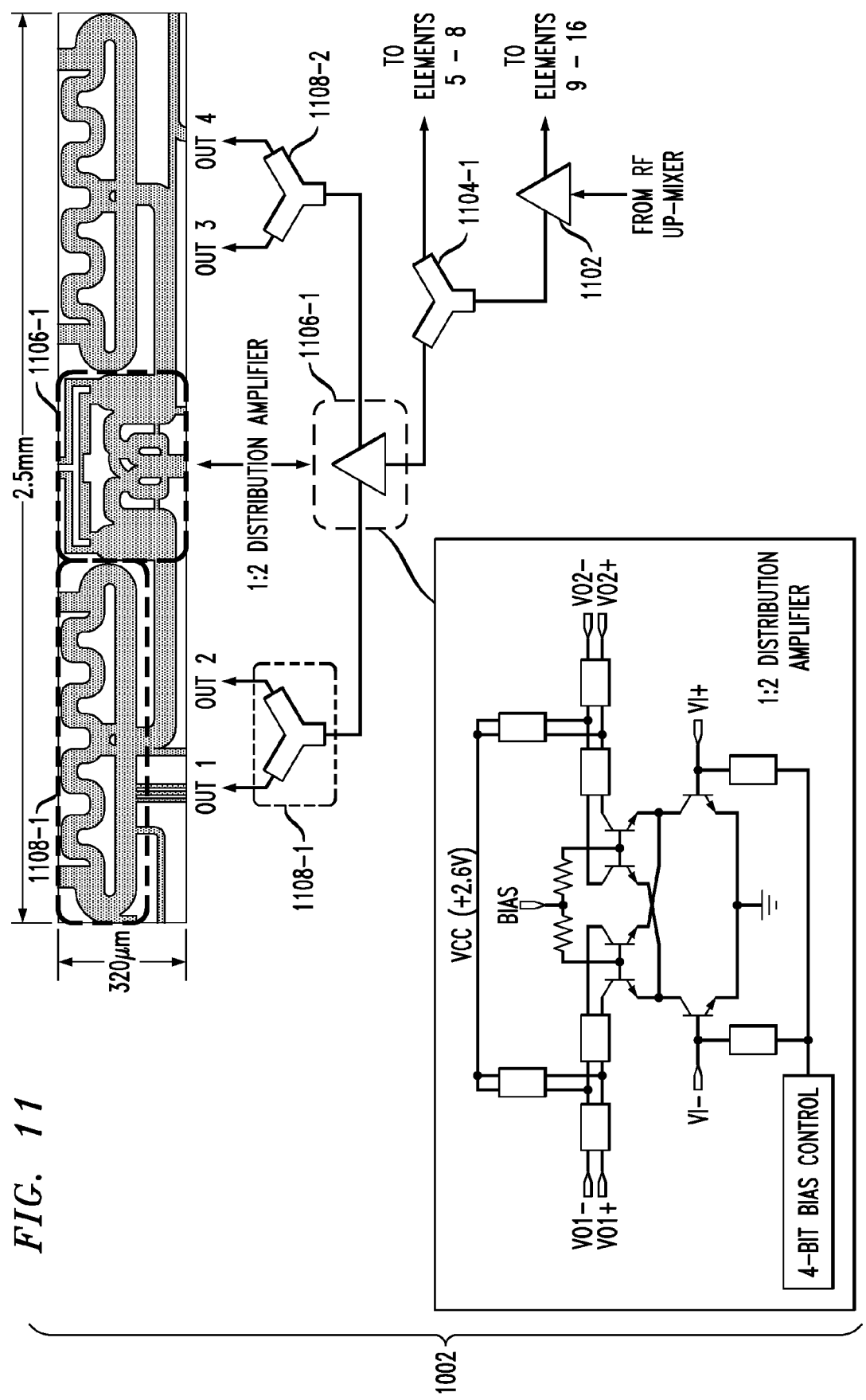
FIG. 11 shows more detailed views of the power divider of the FIG. 10 transmitter.

Referring now to FIG. 11, the power divider tree 1002 includes four levels of dividers, two of which include only passive dividers of the type shown in FIG. 6, and two of which include only active dividers. At the first or root level of the divider tree 1002, there is a single two-way active divider 1102 that receives an input signal from the transmitter core 1010. At the second level of the divider tree, there are two two-way passive dividers 1104, although only one is shown as 1104-1, each receiving an input signal from the first level divider 1102. At the third level of the divider tree, there are four two-way active dividers 1106, although only one is shown as 1106-1, each receiving an input signal from one of the second level dividers 1104.

An inset shows a detailed example of one possible implementation of the two-way active divider 1106-1. In this embodiment, the active divider is implemented as an active distribution amplifier comprising an input differential pair and two separate cascode pairs that evenly split the output current into two branches.

At the fourth and final level of the power divider tree 1002, there are eight two-way passive dividers 1108, two of which are shown as 1108-1 and 1108-2, each receiving an input signal from one of the third level dividers 1106.

Each of the two-way passive dividers 1104 and 1108 of the power divider tree 1002 is configured in substantially the same manner as the divider of FIG. 6. Also shown in the figure is an illustration of a possible physical layout of the passive dividers 1108-1 and 1108-2 and the active divider 1106-1. It can be seen that these three dividers in the present example occupy a compact area of about 320 μm by 2.5 mm, or 0.8 mm$^2$. This compact 1:4 power distribution unit in the present embodiment draws 12 mA from a 2.6V supply and has a single-path gain of 4 dB. The other active and passive dividers in the power divider tree 1102 may be configured in substantially the same manner, arranged into 1:4 power distribution units each with one two-way active divider driving two two-way passive dividers.

As shown in FIG. 10, each RF front end 1004 includes a balanced voltage-controlled phase shifter 1040 and a differential, variable-gain, three-stage power amplifier (PA) 1042. The balanced phase shifter comprises two single-ended RTPSs and has a measured differential phase shift range of 200° with insertion loss varying from 4 dB to 8 dB. To attain >360° phase shift range, a 180° discrete phase shift is implemented in the first stage of the PA. Moreover, by adjusting its bias current, this stage achieves 12 dB of programmable gain which is sufficient to equalize output power variations due to the RTPS, frequency response, and mismatch between individual transmitter elements. Phase shift and element gain are each digitally controlled, and 32 pre-programmed combinations of phase and gain, for a given beam direction, are stored in beam table 1044 of a local memory array in each of the 16 front ends. This allows the transmitter 1000 to be rapidly configured for a specified beam direction by using the above-noted parallel digital interface. Each RF front end in this embodiment is provided with a wide-range output power programmability using four bits of bias control in the final stage of the power amplifier 1042. Each RF front end further includes an antenna 1045 and a power sensor 1046 that senses output power and provides this feedback to the automatic level control unit 1014.

It is to be appreciated that the particular phased array receiver 800 and associated power combiner tree 802 as shown in FIGS. 8 and 9, and the particular phased array transmitter 1000 and associated power divider tree 1002 as shown in FIGS. 10 and 11, are presented by way of illustrative example only, and that the invention can be implemented in a wide variety of other types of communication system receivers and transmitters using other power combining or dividing circuitry.

Additional details regarding the operation of phased array receivers and transmitters in which embodiments of the present invention may be implemented can be found in, for example, A. Natarajan et al., "60 GHz RF-path Phase-shifting Two-element Phased-array Front-end in Silicon," IEEE VLSI Symp., pp. 250-251, June 2009; S. Reynolds et al., "A Silicon 60-GHz Receiver and Transmitter Chipset for Broadband Communications," IEEE JSSC, v. 41, n. 12, pp. 2820-2831, December 2006; E. Cohen et al., "A bidirectional TX/RX four element phased-array at 60 GHz with RF-IF conversion block in 90 nm CMOS process," IEEE RFIC Symp., pp. 207-210, June 2009; S. Reynolds et al., "Second Generation Transceiver Chipset Supporting Multiple Modulations at Gb/s data rates," IEEE BCTM, pp. 192-197, October 2007; J. M. Gilbert et al., "A 4-Gbps Uncompressed Wireless HD A/V Transceiver Chipset," IEEE Micro, pp. 56-64, March-April 2008; K.-J. Koh et al., "A Millimeter-Wave (40-45 GHz) 16-Element Phased-Array Transmitter in 0.18-μm SiGe BiCMOS Technology," IEEE JSSC, v. 44, n. 5, pp. 1498-1509, May 2009; and S. Kishimoto et al., "A 60-GHz Band CMOS Phased Array Transmitter Utilizing Compact Baseband Phase Shifters," IEEE RFIC, pp. 215-218, June 2009; all of which are incorporated by reference herein.

As indicated previously, a given combiner or divider configured in accordance with the invention may be implemented as a component of an integrated circuit. Such a combiner may be used within one integrated circuit to combine signals from other integrated circuits, and a corresponding divider may be used to distribute a signal from one integrated circuit to other integrated circuits. Alternatively, the combiner or divider may be used to combine or distribute signals within a single integrated circuit, such as in an integrated implementation of the phased array receiver and transmitter described previously.

It should therefore again be emphasized that the various embodiments described herein are presented by way of illustrative example only, and should not be construed as limiting the scope of the invention. For example, alternative embodiments of the invention can utilize different combiner or divider configurations and cross-coupling arrangements than those above in the context of the illustrative embodiments. These and numerous other alternative embodiments within the scope of the appended claims will be readily apparent to those skilled in the art.

What is claimed is:

1. A combiner comprising:
   a plurality of inputs;
   an output;
   a plurality of differential transmission lines each coupled between a corresponding one of the inputs and the output; and
   at least one set of additional differential transmission lines arranged in series between any two of the inputs;
   wherein first and second ones of the additional differential transmission lines in the set are coupled to one another using a cross-coupling arrangement.

2. The combiner of claim 1 wherein in the cross-coupling arrangement a positive lead of the first one of the additional differential transmission lines in the set is coupled to a negative lead of the second one of the additional differential transmission lines in the set and a negative lead of the first one of the additional differential transmission lines in the set is coupled to a positive lead of the second one of the additional differential transmission lines in the set.

3. The combiner of claim 1 wherein the plurality of inputs comprises N inputs and the at least one set of additional differential transmission lines comprises N sets of additional differential transmission lines with each such set being arranged in series between a corresponding pair of the N inputs and being coupled to one another using a cross-coupling arrangement.

4. The combiner of claim 1 further comprising a network coupled to the first and second additional differential transmission lines at a location of the cross coupling between said first and second ones of the additional differential transmission lines in the set.

5. The combiner of claim 4 wherein the network is configured to provide at least one of frequency filtering and common mode rejection.

6. The combiner of claim 4 wherein the network comprises at least one of a passive network and an active network.

7. The combiner of claim 6 wherein the network comprises a passive resistive network.

8. The combiner of claim 1 wherein the set of additional differential transmission lines arranged in series between any two of the inputs further includes at least third and fourth additional differential transmission lines with the third additional differential transmission line being coupled between the first additional differential transmission line and one of said any two inputs and the fourth additional differential transmission line being coupled between the second additional differential transmission line and the other of said any two inputs.

9. An integrated circuit comprising the combiner of claim 1.

10. A communication system receiver comprising the combiner of claim 1.

11. A divider comprising:
    a plurality of outputs;
    an input;
    a plurality of differential transmission lines each coupled between the input and a corresponding one of the outputs; and
    at least one set of additional differential transmission lines arranged in series between any two of the outputs;
    wherein first and second ones of the additional differential transmission lines in the set are coupled to one another using a cross-coupling arrangement.

12. The divider of claim 11 wherein in the cross-coupling arrangement a positive lead of the first one of the additional differential transmission lines in the set is coupled to a negative lead of the second one of the additional differential transmission lines in the set and a negative lead of the first one of the additional differential transmission lines in the set is coupled to a positive lead of the second one of the additional differential transmission lines in the set.

13. The divider of claim 11 wherein the plurality of outputs comprises N outputs and the at least one set of additional differential transmission lines comprises N sets of additional differential transmission lines with each such set being arranged in series between a corresponding pair of the N outputs and being coupled to one another using a cross-coupling arrangement.

14. The divider of claim 11 further comprising a network coupled to the first and second additional differential transmission lines at a location of the cross coupling between said first and second ones of the additional differential transmission lines in the set.

15. The divider of claim 14 wherein the network is configured to provide at least one of frequency filtering and common mode rejection.

16. The divider of claim 14 wherein the network comprises at least one of a passive network and an active network.

17. The divider of claim 16 wherein the network comprises a passive resistive network.

18. The divider of claim 11 wherein the set of additional differential transmission lines arranged in series between any two of the outputs further includes at least third and fourth additional differential transmission lines with the third additional differential transmission line being coupled between the first additional differential transmission line and one of said any two outputs and the fourth additional differential transmission line being coupled between the second additional differential transmission line and the other of said any two outputs.

19. An integrated circuit comprising the divider of claim 11.

20. A communication system transmitter comprising the divider of claim 11.

* * * * *